United States Patent [19]

Cordes, III

[11] 4,054,721
[45] Oct. 18, 1977

[54] PHOTOSENSITIZERS FOR RADIATION-CURABLE COATINGS

[75] Inventor: William Frederick Cordes, III, East Brunswick, N.J.

[73] Assignee: American Cyanamid Company, Stamford, Conn.

[21] Appl. No.: 744,366

[22] Filed: Nov. 23, 1976

[51] Int. Cl.² ............................................. B05D 3/06
[52] U.S. Cl. ............................ 428/500; 96/115 P; 204/159.23; 252/426; 260/590 D; 260/592; 427/54
[58] Field of Search ............... 427/53, 54; 204/159.23; 260/590 C, 590 D, 592; 252/426; 96/115 P; 428/500

[56] References Cited
U.S. PATENT DOCUMENTS

| | | |
|---|---|---|
| 3,647,879 | 3/1972 | Massarani et al. ............... 260/592 |
| 3,882,142 | 5/1975 | Walworth et al. ............... 260/590 D |
| 3,937,737 | 2/1976 | Eiglmeier ............... 260/592 |
| 4,016,334 | 4/1977 | Collins et al. ............... 427/54 |

*Primary Examiner*—John H. Newsome
*Attorney, Agent. or Firm*—Philip Mintz

[57] ABSTRACT

2-Alkoxy-1,3-diphenyl-1,3-propanedione compounds have been found useful as photosensitizers in radiation-curable coating compositions. The novel photosensitizers of this invention have the structural formula

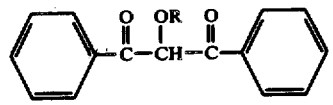

in which R is an alkyl radical of from one eight carbon atoms.

11 Claims, No Drawings

PHOTOSENSITIZERS FOR RADIATION-CURABLE COATINGS

BACKGROUND OF THE INVENTION

This invention relates to ultraviolet radiation-curable coating compositions. More particularly it relates to photopolymerizable coating compositions containing a phenacyl ester photosensitizer and a tertiary aliphatic amine, and to polymerized coatings obtainable therefrom.

It is well-known that polymerizable coating compositions can be cured by exposure to actinic radiation, such as ultraviolet light. In general, such compositions comprise (a) a photopolymerizable polyethylenically unsaturated compound and (b) a photosensitizer, with or without (c) a colorant. Various photosensitizers such as acetophenones, benzoin acetate, benzaldehydes, benzoins, and 2,2-dialkoxyacetophenones, used alone or in combination with a trialkylamine, have been used as initiators for photopolymerizations. See Sandner, et al., U.S. Pat. No. 3,715,293 and Shur, et al., U.S. Pat No. 3,772,062. Since none of the known photosensitizers has been found to be completely satisfactory, research continues in order to find compounds or mixtures which will be more satisfactory. The present invention arose out of such research and resulted in the discovery of novel photosensitizer compositions which are useful for the photopolymerization of radiation-curable compositions.

I have discovered that compounds having the formula (I):

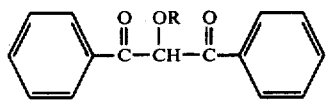

in which R is an alkyl radical of one to eight carbon atoms are effective sensitizers for curing polyethylenically unsaturated coating compositions by irradiation with ultraviolet light. Coating compositions containing an effective amount of a photosensitizer of formula (I) alone, or in combination with a tertiary aliphatic amine, can be rapidly cured by exposure to ultraviolet light to obtain a polymerized coating.

The present invention is applicable to the coating, or printing, of various substrates such as paper, cardboard, boxboard, wood, metals, textiles, plastics, and the like. The substrate may be in any convenient form such as films, sheets, rods, tubes, tubing, filaments, or shaped articles, such as bottles, cans, and the like. The substrate itself can be preprinted and overcoated with a clear photopolymerizable composition. The substrate may be printed by including a colorant in the photopolymerizable composition and then overcoated with a clear coating.

The photopolymerizable compounds useable in the present invention are free radical initiated polyfunctional ethylenically unsaturated monomers and prepolymers, e.g., dimers, trimers and other oligomers; and mixtures and copolymers thereof. The term "polyethylenically unsaturated", as used herein, refers to compounds having two or more terminal ethylene groups. The photopolymerizable monomers and prepolymers may be generally described as the acrylic, methacrylic and itaconic acid esters of aliphatic polyhydricalcohols such as, for example, the di- and polyacrylates, the di- and polymethacrylates and the di- and polyitaconates of ethylene glycol, triethylene glycol, tetraethylene glycol, tetramethyleneglycol, trimethylolethane, trimethylolpropane, pentaerythritol, dipentaerythritol, and the like, and their prepolymers. Typical compounds include, but are not limited to, 1,1,1-trimethylolpropane triacrylate, 1,1,1-trimethylolpropane trimethacrylate, 1,1,1-trimethylolpropane triitaconate, pentaerythritol tetraacrylate, pentaerythritol tetramethacrylate, 1,1,1-trimethylolethane triacrylate, 1,1,1-trimethylolethane trimethacrylate, tetramethyleneglycol diacrylate, ethylene glycol dimethacrylate, tetraethyleneglycol diacrylate, triethyleneglycol dimethacrylate, tetraethylene glycol dimethacrylate, and the like; and the prepolymers and mixtures thereof.

The above-described esters may be obtained in any convenient manner, for example, by ester interchanging a lower alkyl ester of the acid with the alcohol in the presence of a suitable catalyst, or by the reaction of the alcohol with the acid, e.g. acrylic or methacrylic acid.

Illustrative examples of the compounds of Formula I include 2-methoxy-1,3-diphenyl-1,3-propanedione, 2-n-butoxy- -1,3-diphenyl-1,3-propanedione, 2-ethoxy-1,3-diphenyl-1,3 -propanedione, 2-propoxy-1,3-diphenyl-1,3-propanedione, 2-hexyloxy-1,3-diphenyl-1,3-propanedione, 2-(2-ethylhexyloxy 1,3-diphenyl-1,3-propanedione, and the like.

These compounds have not heretofore been known to be useful as photosensitizers in radiation-curable coating compositions. These compounds can be prepared by acylating a 2-alkoxyacetophenone with benzophenone or benzoyl chloride in the presence of sodamide as described by Munch-Petersen and Hauser, J. Am. Chem. Soc. 71. 770-3, (1949). The 2-alkoxyacetophenone can be prepared by the procedure of Moffett and Shriner, "Organic Syntheses", John Wiley and Sons, Inc., New York, N. Y., Vol. 21, pg. 79, (1941).

Any suitable source of emission may be used which emits radiation from about 2,000-8,000 Angstroms, preferably about 2,500-4,500 Angstroms. Suitable sources are mercury-vapor lamps, mercury arcs, carbon arcs, xenon arcs, sunlamps, lasers, and the like. All of these devices and sources are well-known in the art. Particularly efficient sources are the ultraviolet-mercury lamps and swirl-flow plasma arc radiation devices described in U.S. Pat. No. 3,364,387.

While any source of ultraviolet emission can be used, as indicated above, the apparatus used in the exemplification of this invention was Hanovia Ultraviolet Curing Systems Model 45080 (Conrad Precision Industries, Inc., Newark, N. J.) having a 2500 watt Hanovia medium pressure mercury vapor ultraviolet lamp with a beam width of about 1-2 inches placed about 2.5 inches above the coated substrate. The substrate was a matted steel panel (4 inches x 8 inches x 0.032 inch; Model R-48; The Q-Panel Company, Cleveland, Ohio) placed on a conveyor moving at speeds of 70-410 feet per minute, preferably about 180 feet per minute. The dwell time of the coating under the beam ranges from about 0.01-0.14 second, preferably about 0.028-0.055 second.

The concentration of 2-alkoxy-1,3-diphenyl-1,3-propanedione sensitizer which is incorporated in the composition in order to achieve maximum photosensitization varies according to the organic material of the composition, according to the intensity of the light radiation and the duration of exposure. However, for most purposes it is sufficient to use an amount of the compound of Formula I within the range of about 1 to 10 percent by weight, preferably within the range of about 5 to 7 percent of weight, based on the weight of the photopolymerizable compound.

The ingredients may be combined by any of the well-known procedures, for example, by mixing, grinding, or heating. The resulting composition is applied in any suitable manner onto the surface of the substrate. The compositions of the present invention may be used in relatively thick layers, or as thin films having a thickness of about 0.5 to 150 microns. The film thickness is usually about 10 microns.

In addition to the 2-alkoxy-1,3-diphenyl-1,3-propanediones defined hereinbefore, one can also include in the coating composition any of the previously known photosensitizers which include such compounds as acetophenone, benzophenone, xanthone, fluorene, fluorenone, benzaldehyde, anthraquinone, 4-methoxybenzophenone, benzoin, 2-chloroanthraquinone, polychlorinated polyphenyl resins, such as the Arochlors (Monsanto Chemical Co.); benzoin acetate, benzoin methyl ether, benzoin isobutoxymethylether; polybenzoin, 2,2-diethoxyacetophenone; 2,2-dimethoxyacetophenone, 2-tert-butylanthraquinone, 2-methylanthraquinone, azoisobutyronitrile, and the like.

The photopolymerizable compound and sensitizer may also be advantageously used in combination with 1 to 10 percent by weight, preferably 5 to 7 percent by weight, based on the weight of the photopolymerizable compound, of a tertiary aliphatic amine, such as triethanolamine, methyldiethanolamine, ethyldiethanolamine, triethylamine, morpholine, and the like. The tertiary aliphatic amine must be compatible with the photopolymerizable composition and not significantly affect the polymerization rate thereof when exposed to ultraviolet light. The preferred tertiary aliphatic amine is methyldiethanolamine. The tertiary amine is believed to function as a synergizing agent, in some cases.

Optionally, the compositions of this invention may also contain other additives such as antioxidants, plasticizers, light stabilizers, anti-slipping and anti-static agents, lubricants, and colorants, such as dyes and pigments.

Illustrative colorants include organic and inorganic pigments such as Phthalocyanine Blue 20, chrome yellow, carbon black, molybdaate orange, Lithol Rubine Red, titanium white, and the like, and mixtures thereof.

In the examples which follow the number of passes under the beam necessary to dry the coating composition is determined by touching the exposed composition. The composition is considered dry when it is non-sticky. The composition is considered mar-resistant if it resists scratching by means of a laboratory spatula. All parts in the examples are by weight.

EXAMPLE 1

Coating Compositions were prepared from the following amounts of components:

Composition A 100 parts of 1,1,1-trimethylolpropane triacrylate
5 parts of 2-methoxy-1,3-diphenyl-1,3-propanedione

Composition B 100 parts of 1,1,1-trimethylolpropane triacrylate
5 parts of 2-methoxy-1,3-diphenyl-1,3-propanedione
5 parts of methyldiethanolamine

EXAMPLE 2

The coatings of Example 1 were separately applied to matted steel panels (Model R-48, The Q Panel Company, Cleveland, Ohio) at a wet film thickness of 0.5 mil. The wet-coated substrate was then placed on a conveyor and exposed to ultraviolet radiation by being passed under a 2500 watt medium pressure mercury vapor lamp (Hanovia Ultraviolet Curing Systems, Model 45080) at a distance of about 2.5 inches. The duration of exposure was 0.028 sec. in each case.

Non-sticky, mar-resistant coatings were produced with Compositions A and B after only one pass each under the ultraviolet light. These results are equivalent to results obtained with a composition containing 100 parts of 1,1,1-trimethylolpropane triacrylate and 5 parts of 2,2-diethoxyacetophenone, a well-known photosensitizer.

EXAMPLE 3

Coating Compositions are prepared containing the following components:

Composition A 100 parts of 1,1,1-trimethylolpropane trimethacrylate
5 parts of 2-n-butoxy-1,3-diphenyl-1,3-propanedione

Composition B 100 parts of 1,1,1-trimethylolpropane trimethacrylate
5 parts of 2-n-butoxy-1,3-diphenyl-1,3-propanedione
5 parts of triethanolamine When compositions A and B are separately applied to steel panels and irradiated with ultraviolet light in the manner of Example 2, similar results are obtained.

EXAMPLE 4

Coating compositions are prepared containing the following components:

Composition A 100 parts of 1,1,1-trimethylolpropane triitaconate
2 parts of 2-(2-ethylhexyloxy)-1,3-diphenyl-1,3-propanedione

Composition B 100 parts of 1,1,1-trimethylolpropane triitaconate
2 parts of 2-(2-ethylhexyloxy)-1,3-diphenyl-1,3-propanedione
2 parts of ethyldiethanolamine When compositions A and B are separately applied to steel panels and irradiated with ultraviolet light in the manner of Example 2, similar results are obtained.

I CLAIM:

1. A liquid composition curable by ultraviolet radiation comprising a photopolymerizable polyethylenically unsaturated ester of a polyhydric alcohol and an effective amount of a photosensitizer compound represented by the formula:

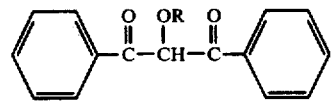

wherein R is an alkyl radical of 1 to 8 carbon atoms.

2. The composition of claim 1 wherein the photosensitizer is present in the range of 1 to 10% by weight of said polyethylenically unsaturated ester.

3. The composition of claim 2 wherein the photosensitizer is 2-methoxy-1,3-diphenyl-1,3-propanedione.

4. The composition of claim 2 wherein the polyethylenically unsaturated ester is 1,1,1-trimethylolpropane triacrylate.

5. The composition of claim 2 wherein the composition additionally contains a tertiary aliphatic amine in the range of 1 to 10% by weight of said polyethylenically unsaturated compound.

6. The composition of claim 5 wherein the photosensitizer is 2-methoxy-1,3-diphenyl-1,3-propanedione and the tertiary aliphatic amine is methyldiethanolamine.

7. The method of providing a polymeric coating on a substrate comprising coating said substrate with a composition of claim 1 and then exposing the coated substrate to an effective amount of ultraviolet radiation.

8. A substrate carrying a polymeric coating comprising a cured composition of claim 1.

9. A substrate carrying a polymeric coating comprisng a cured composition of claim 3.

10. A substrate carrying a polymeric coating comprising a cured composition of claim 4.

11. A substrate carrying a polymeric coating comprising a cured composition of claim 5.

* * * * *